(12) United States Patent
Chen et al.

(10) Patent No.: US 10,782,717 B1
(45) Date of Patent: Sep. 22, 2020

(54) JITTER COMPENSATION IN INTEGRATED CIRCUIT DEVICES

(71) Applicant: Texas Instruments Incorporated, Dallas, TX (US)

(72) Inventors: Jikai Chen, Allen, TX (US); Yonghui Tang, Plano, TX (US); Yuan Rao, Allen, TX (US); Huanzhang Huang, Plano, TX (US); Yanli Fan, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/656,742

(22) Filed: Oct. 18, 2019

(51) Int. Cl.
*G05F 1/56* (2006.01)
*H02M 3/158* (2006.01)
*H03K 3/013* (2006.01)
*H04B 1/16* (2006.01)
*H04B 1/12* (2006.01)

(52) U.S. Cl.
CPC .............. *G05F 1/56* (2013.01); *H02M 3/158* (2013.01); *H03K 3/013* (2013.01); *H04B 1/12* (2013.01); *H04B 1/16* (2013.01)

(58) Field of Classification Search
CPC ... G05F 1/10; G05F 1/46; G05F 1/461; G05F 1/462; G05F 1/465; G05F 1/467; G05F 1/468; G05F 1/56; G05F 1/565; G05F 1/569; G05F 1/575; G05F 1/59; G05F 1/613; H02M 3/158; H02M 3/1584
USPC ................................................... 327/551, 332
See application file for complete search history.

(56) References Cited

U.S. PATENT DOCUMENTS

| | | | |
|---|---|---|---|
| 8,797,087 B2* | 8/2014 | Schimper ................ | G05F 1/575 323/313 |
| 10,374,647 B1* | 8/2019 | Chen ...................... | H03K 5/153 |
| 2006/0170401 A1* | 8/2006 | Chen ...................... | G05F 1/569 323/273 |
| 2011/0221521 A1* | 9/2011 | Razzell .................... | H04B 3/06 330/69 |
| 2014/0207984 A1* | 7/2014 | Maung .................. | G06F 13/385 710/105 |
| 2015/0015223 A1* | 1/2015 | Chen ........................ | G05F 1/575 323/280 |

* cited by examiner

*Primary Examiner* — Tomi Skibinski
(74) *Attorney, Agent, or Firm* — John R. Pessetto; Charles A. Brill; Frank D. Cimino

(57) ABSTRACT

A jitter compensation circuit operates in a first conduction state responsive to a high-to low transition of data and a low-to-high transition of data. The circuit operates in a second conduction state when there is no transition of data. The circuit compensates charge to a voltage supply in the first conduction state, thereby reducing voltage drop caused by transition of data.

23 Claims, 3 Drawing Sheets

JITTER COMPENSATION IN INTEGRATED CIRCUIT DEVICES

BACKGROUND

The disclosure generally relates to jitter compensation in integrated circuit devices.

DESCRIPTION OF THE RELATED ART

High-speed electrical devices such as USB 3, HDMI, and display ports are used in high-speed data links. These high-speed electrical devices are generally powered by a regulated power supply, which in ideal conditions provides a stable voltage supply (e.g., 5V, 3.3V, 1.8V). However, when a transition of data occurs (e.g., low-to-high or high-to-low), the devices require increased amount of current from a power supply. The sudden increase in current demand causes transient loads in the power supply. Since a power supply is unable to meet a sudden spike in demand for current, the supply voltage usually drops but later recovers, causing fluctuations in supply voltage. The fluctuations in supply voltage cause jitter in data transmission. In high-speed electrical devices, jitter causes uncertainty in data transmission and reception that may lead to errors and system failure. One approach to reducing jitter is to couple a large capacitor at the output of the power supply. However, a large capacitor is expensive to implement in integrated circuits.

SUMMARY

Various aspects of the present disclosure are directed to jitter compensation circuits. In one aspect, a jitter compensation circuit includes a first transistor having a first terminal coupled to a first voltage supply and having a second terminal coupled to a second voltage supply. The first transistor has a gate terminal driven by a first gate voltage responsive to a high-to low transition of data to operate in a first conduction state and to operate in a second conduction state when there is no high-to-low transition of data. The circuit further includes a second transistor having a first terminal coupled to the first voltage supply and having a second terminal coupled to the second voltage supply. The second transistor has a gate terminal driven by a second gate voltage responsive to a low-to-high transition of data to operate in the first conduction state and to operate in the second conduction state when there is no low-to-high transition of data. The circuit also includes a third transistor having a first terminal coupled to the first voltage supply and having a second terminal connected to a gate terminal. The circuit also includes a comparator having a first input coupled to the second voltage supply and having a second input coupled to a reference voltage. The comparator generates a feedback control signal responsive to the second voltage supply and the reference voltage. The circuit also includes a current source coupled between the third transistor and ground. The current source conducts a control current responsive to the feedback control signal. The circuit also includes a first R-C circuit configured to generate the first gate voltage responsive to the high-to-low transition of data. The first R-C circuit is coupled to apply the first gate voltage to the gate terminal of the first transistor. The circuit also includes a second R-C circuit configured to generate the second gate voltage responsive to the low-to-high transition of data. The second R-C circuit is coupled to apply the second gate voltage to the gate terminal of the second transistor. The first R-C circuit comprises a first resistor coupled to a first capacitor, wherein the first R-C circuit is configured to control the duration of the first conduction state responsive to the high-to-low transition of data. The second R-C circuit comprises a second resistor coupled to a second capacitor, wherein the second R-C circuit is configured to control the duration of the first conduction state responsive to the low-to-high transition of data. The first resistor is coupled between the gate terminals of the first and third transistors. The second resistor is coupled between the gate terminals of the second and third transistors. The first and second transistors mirror current in the third transistor when there is no transition of data.

In an additional aspect of the disclosure, a jitter compensation system includes a voltage regulator coupled to receive a first voltage supply and configured to generate a second voltage supply. The system further includes a closed-loop control circuit having a first input coupled to the second voltage supply and having a second input coupled to receive a reference voltage. The closed-loop control circuit generates a feedback control signal responsive to the second voltage supply and the reference voltage. The system also includes a charge compensation circuit having a first input coupled to receive a first gate voltage responsive to a high-to-low transition of data and configured to operate in a first conduction state responsive to the first gate voltage and to operate in a second conduction state when there is no high-to-low transition of data. The charge compensation circuit has a second input coupled to receive a second gate voltage responsive to a low-to-high transition of data and configured to operate in the first conduction state responsive to the second gate voltage and to operate in the second conduction state when there is no low-to-high transition of data. The charge compensation circuit has a third input coupled to the first voltage supply and having a fourth input coupled to receive the feedback control signal. The charge compensation circuit charges the second voltage supply during the first conduction state.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein. Rather, these descriptions are provided so that this disclosure will satisfy applicable requirements.

Figure 1:
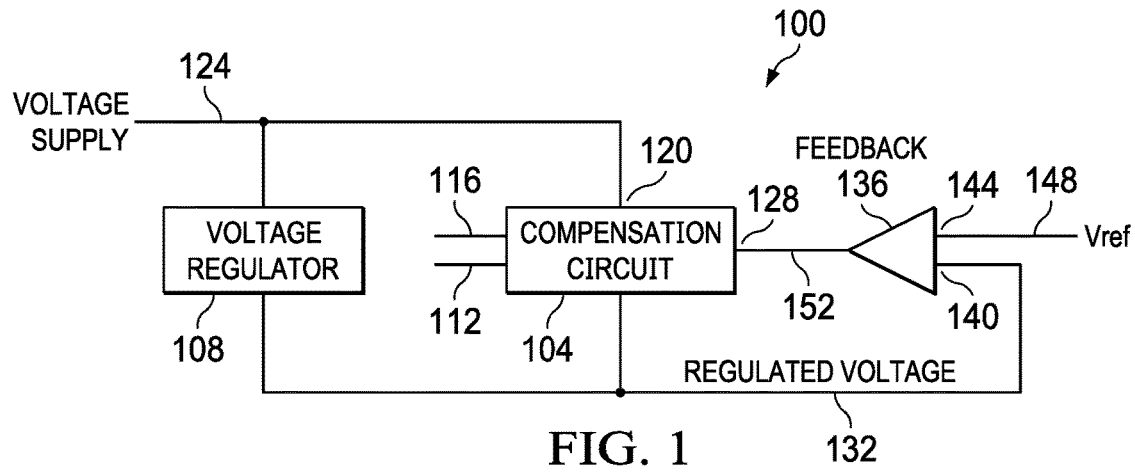
FIG. 1 is a block diagram of a jitter compensation system.

FIG. 1 is a block diagram of a jitter compensation system 100 in accordance with an exemplary embodiment. The jitter compensation system 100 includes a compensation circuit 104 coupled to a voltage regulator 108. Responsive to a high-to-low or a low-to-high transition of data, the compensation circuit 104 compensates charge by providing current to the output of the voltage regulator 108, thereby reducing sudden drop in voltage caused by the transition of data.

With reference to FIG. 1, the compensation circuit 104 has a first input 112 coupled to receive a first gate voltage which is generated responsive to a high-to-low transition of data. The compensation circuit 104 is configured to operate in a first conduction state responsive to the first gate voltage and is configured to operate in a second conduction state when no high-to-low transition of data occurs. The high-to-low transition of data refers to a falling edge of data transition.

The compensation circuit 104 also has a second input 116 coupled to receive a second gate voltage which is generated responsive to a low-to-high transition of data. The compensation circuit 104 is configured to operate in the first conduction state responsive to the second gate voltage and is configured to operate in the second conduction state when no low-to-high transition of data occurs. The low-to-high transition of data refers to a rising edge of data transition.

The compensation circuit 104 also has a third input 120 coupled to a first voltage supply 124, which may be provided by a power supply. The power supply may be an external power supply configured to power an integrated circuit (IC) or may be an internal supply built inside an IC.

With continuing reference to FIG. 1, the voltage regulator 108 has an input coupled to receive the first voltage supply 124. The voltage regulator 108 may, for example, be a dc-dc switched regulator which outputs a second voltage supply 132.

The system 100 includes a closed-loop control circuit 136 having a first input 140 coupled to the second voltage supply 132. The closed-loop control circuit 136 has a second input 144 coupled to receive a reference voltage 148. The closed-loop control circuit 136 generates a feedback control signal 152 responsive to the second voltage supply 132 and the reference voltage 148.

The compensation circuit 104 also has a fourth input 128 coupled to receive the feedback control signal. The feedback control signal biases the compensation circuit 104 to operate in the second conduction state in the absence of a low-to-high or a high-to-low transition of data. When there is a transition of data, the compensation circuit 104 operates in the first conduction state to supplement charge by providing current to the voltage regulator output, thus reducing sudden voltage drops at the second voltage supply 132.

Figure 2:
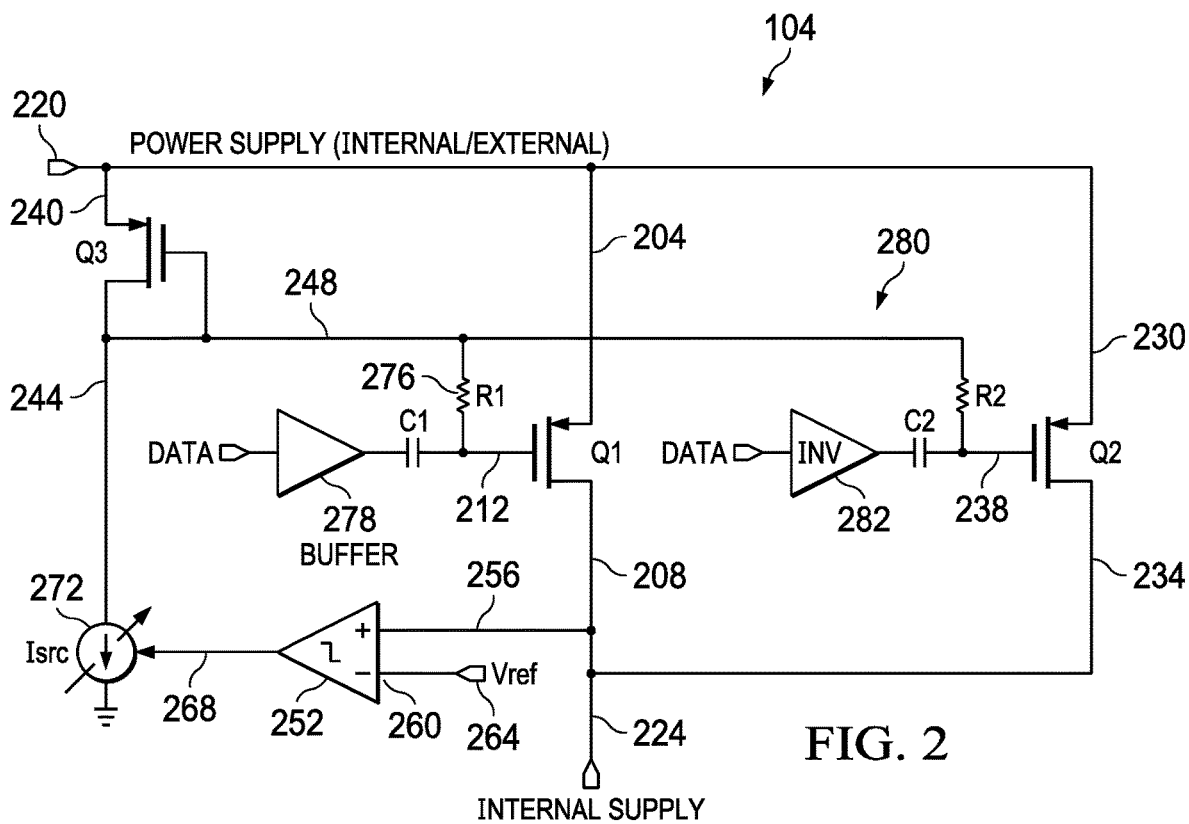
FIG. 2 is a schematic diagram of a compensation circuit.

FIG. 2 is a more detailed schematic diagram of the exemplary jitter compensation circuit 104. The circuit 104 includes a transistor Q1 (e.g., PMOS transistor) having a first terminal 204 (e.g., source terminal) coupled to a first voltage supply 220 and having a second terminal 208 (e.g., drain terminal) coupled to a second voltage supply 224. The transistor Q1 has a gate terminal 212 which is driven by a first gate voltage responsive to a high-to low transition of data. The transistor Q1 operates in a first conduction state when the first gate voltage is applied to the gate terminal 212 responsive to the high-to-low transition of data. When there is no high-to-low transition of data, the first gate voltage is not applied to the gate terminal 212, and as a consequence the first transistor Q1 operates in a second conduction state.

The circuit 104 also includes a transistor Q2 (e.g., PMOS transistor) having a first terminal 230 (e.g., source terminal) coupled to the first voltage supply 220 and having a second terminal 234 (e.g., drain terminal) coupled to the second voltage supply 224. The transistor Q2 has a gate terminal 238 which is driven by a second gate voltage responsive to a low-to-high transition of data. The transistor Q2 operates in the first conduction state when the second gate voltage is applied to its gate terminal 238 responsive to the low-to-high transition of data. When there is no low-to-high transition of data, the second gate voltage is not applied to the gate terminal 238, and as a consequence the transistor Q2 operates in the second conduction state.

The circuit 104 also includes a transistor Q3 (e.g., PMOS transistor) having a first terminal 240 (e.g., source terminal) coupled to the first voltage supply 220 and having a second terminal 244 (e.g., drain terminal) connected to its gate terminal 248.

The circuit 104 also includes a comparator 252 having a first input 256 coupled to the second voltage supply 224 and having a second input 260 coupled to a reference voltage 264. The comparator 256 generates a feedback control signal 268 responsive to the second voltage supply 224 and the reference voltage 264. The circuit 104 also includes a current source 272 coupled between the transistor Q3 and ground. The current source 272 conducts a control current responsive to the feedback control signal 268.

With continuing reference to FIG. 2, the circuit 104 also includes a first R-C circuit 276 comprising a capacitor C1 and a resistor R1. The first R-C circuit 276 may be coupled to data via a buffer 278. The first R-C circuit 276 generates the first gate voltage responsive to the high-to-low transition of data. More specifically, the high-to-low transition of data reverse biases the gate to source voltage of the transistor Q1 (PMOS transistor), causing the transistor Q1 to operate in the first conduction state. The first R-C circuit 276 has a decay time determined by R1 and C1, which determines the duration (i.e., time period) of the first conduction state of the transistor Q1.

The circuit 104 also includes a second R-C circuit 280 comprising a capacitor C2 and a resistor R2. The second R-C circuit 280 may be coupled to data via an inverting buffer 282. The second R-C circuit 280 generates the second gate voltage responsive to the low-to-high transition of data. More specifically, the low-to-high transition of data reverse biases the gate to source voltage of the transistor Q2 (PMOS transistor), causing the transistor Q2 to operate in the first conduction state. The second R-C circuit 280 has a decay time determined by R2 and C2, which determines the duration (i.e., time period) of the first conduction state of the transistor Q2.

According to embodiments of the disclosure, the resistor R1 is coupled between the gate terminals 212, 248 of the transistors Q1 and Q3, and the resistor R2 is coupled between the gate terminals 238, 248 of the transistors Q2 and Q3. If no high-to-low or low-to-high transition of data occurs, the voltage across the resistors R1 and R2 remain close to zero. Thus, when no transition of data occurs, the three gate terminals 212, 238 and 248 remain approximately at a same potential, causing the transistors Q1 and Q2 to mirror current in the transistor Q3. Since the current in the transistor Q3 is adjusted by the current source 272, the current in the transistors Q1 and Q2 are controlled by the current source 272 when no transition of data occurs.

According to embodiments of the disclosure, both the first and the second conduction states are in a linear operating region of the PMOS transistors. However, the transistors Q1 and Q2 conduct more current in the first conduction state responsive to the transition of data than in the second conduction state when no transition of data occurs.

Thus, in the absence of a transition of data both the transistors Q1 and Q2 operate in the second conduction state, and in second conduction state the transistors Q1 and Q2 mirror current in the transistor Q3. When a high-to-low transition of data occurs, the transistor Q1 operates in the first conduction state and supplements charge to the voltage regulator output, which reduces a sudden voltage drop. Similarly, when a low-to-high transition of data occurs, the transistor Q2 operates in the first conduction state and supplements charge to the voltage regulator output to reduce a sudden voltage drop. However, the duration of the first conduction state of the transistors Q1 and Q2 is limited by the decay time of the R-C circuits 276 and 280. Specifically, the decay time of the first R-C circuit 276 limits the duration of the first conduction state of the transistor Q1, causing the transistor Q1 to return to the second conduction state. Similarly, the decay time of the second R-C circuit 280 limits the duration of the first conduction state of the transistor Q2, causing the transistor Q2 to return to the second conduction state.

Figure 3:
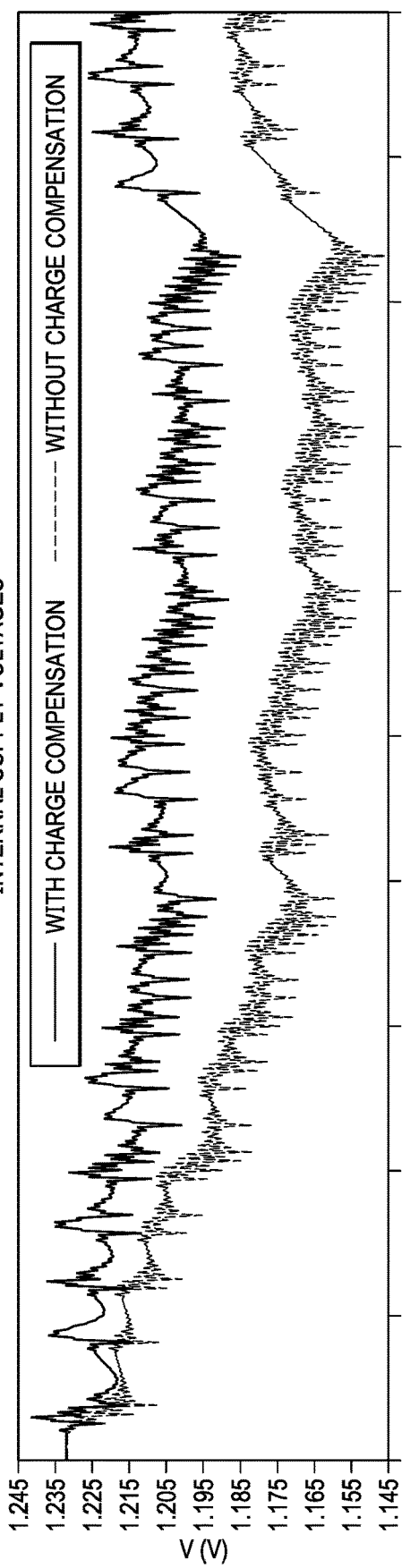
FIG. 3 shows voltage waveforms of a regulated power supply.
Figure 3:
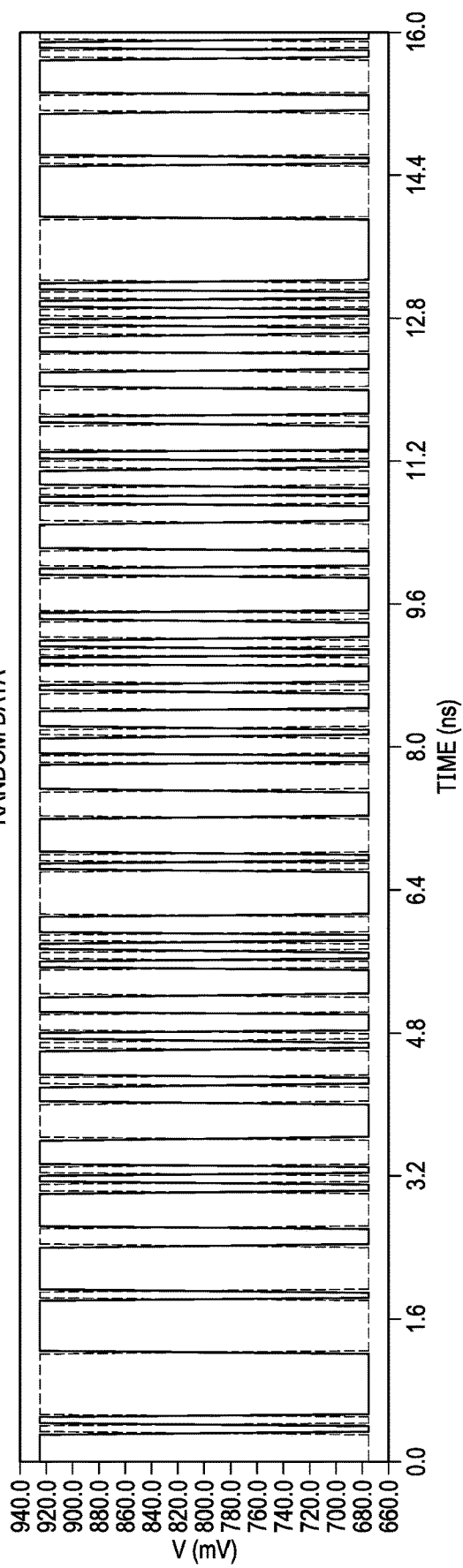

FIG. 3 shows output voltage waveforms of a regulated power supply without a compensation circuit and with the aid of a compensation circuit. With a data rate of 10 Gbps, a low-to-high and a high-to-low transition of data causes the output voltage to drop excessively without the aid of a compensation circuit. However, when the compensation circuit is added, the output voltage drop is reduced considerably.

Figure 4:
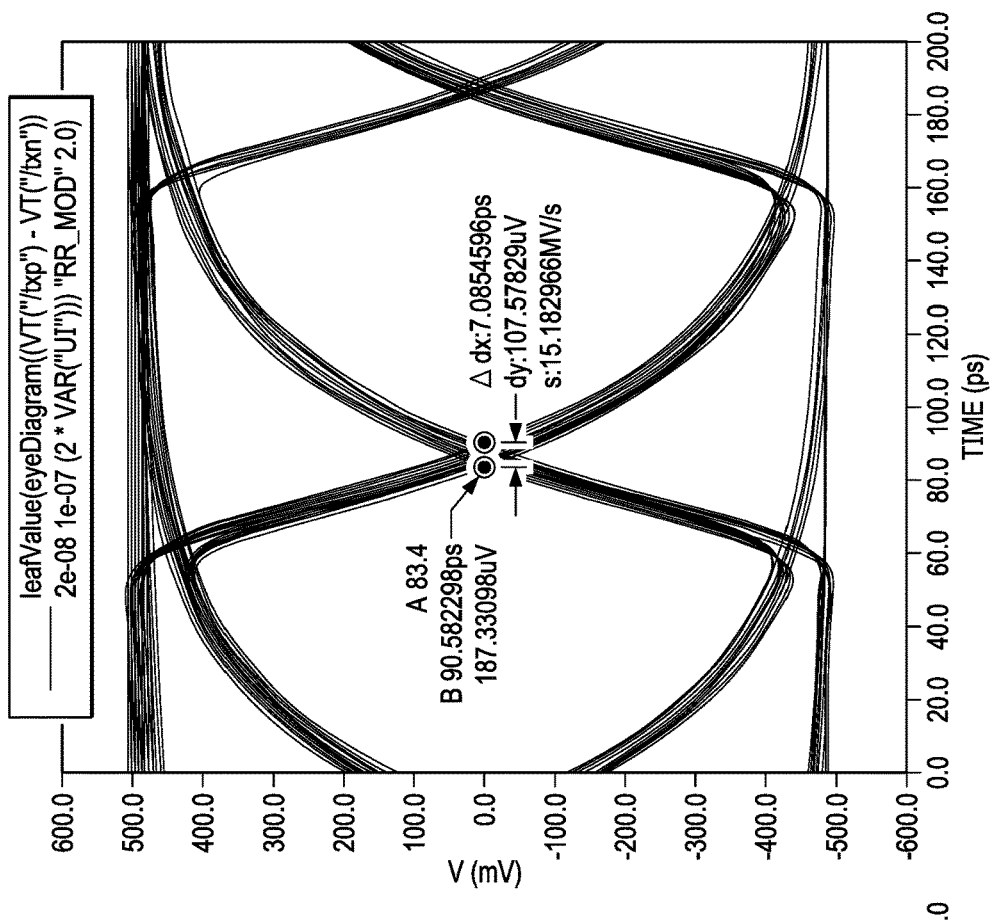
FIG. 4 illustrates an eye diagram without a compensation circuit and with the aid of a compensation circuit.
Figure 4:
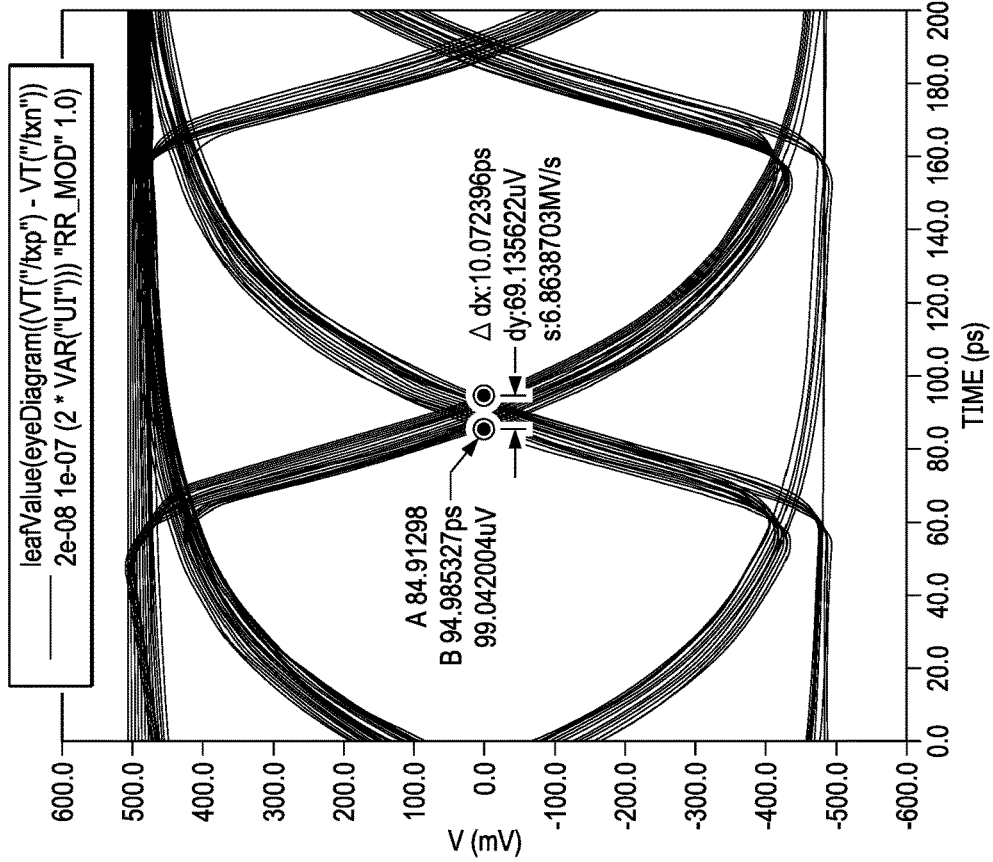

FIG. 4 illustrates an eye diagram of jitter without a compensation circuit and an eye diagram of jitter with the aid of a compensation circuit. The jitter is approximately 10.1 ps without the compensation circuit, but when the compensation circuit is added, the jitter is reduced to 7.1 ps.

Various illustrative components, blocks, modules, circuits, and steps have been described above in general terms of their functionality. Whether such functionality is implemented as hardware or software depends upon the particular application and design constraints imposed on the overall system. The described functionality may be implemented in varying ways for each particular application, but such implementation decision should not be interpreted as causing a departure from the scope of the present disclosure.

For simplicity and clarity, the full structure and operation of all systems suitable for use with the present disclosure is not being depicted or described herein. Instead, only so much of a system as is unique to the present disclosure or necessary for an understanding of the present disclosure is depicted and described.

What is claimed is:

1. A jitter compensation circuit comprising:
   a first transistor having a first terminal coupled to a first voltage supply and having a second terminal coupled to a second voltage supply, the first transistor having a gate terminal driven by a first gate voltage responsive to a high-to low transition of data to operate in a first conduction state and to operate in a second conduction state when there is no high-to-low transition of data;
   a second transistor having a first terminal coupled to the first voltage supply and having a second terminal coupled to the second voltage supply, the second transistor having a gate terminal driven by a second gate voltage responsive to a low-to-high transition of data to operate in the first conduction state and to operate in the second conduction state when there is no low-to-high transition of data;
   a third transistor having a first terminal coupled to the first voltage supply and having a second terminal connected to a gate terminal;
   a comparator having a first input coupled to the second voltage supply and having a second input coupled to a reference voltage, the comparator configured to generate a feedback control signal responsive to the second voltage supply and the reference voltage; and
   a current source coupled between the third transistor and ground, the current source configured to conduct a control current responsive to the feedback control signal.

2. The jitter compensation circuit of claim 1 further comprising:
   a first R-C circuit configured to generate the first gate voltage responsive to the high-to-low transition of data and coupled to apply the first gate voltage to the gate terminal of the first transistor; and
   a second R-C circuit configured to generate the second gate voltage responsive to the low-to-high transition of data and coupled to apply the second gate voltage to the gate terminal of the second transistor.

3. The jitter compensation circuit of claim 2, wherein the first R-C circuit comprises a first resistor coupled to a first capacitor, and wherein the first R-C circuit is configured to control the duration of the first conduction state responsive to the high-to-low transition of data.

4. The jitter compensation circuit of claim 2, wherein the second R-C circuit comprises a second resistor coupled to a second capacitor, and wherein the second R-C circuit is configured to control the duration of the first conduction state responsive to the low-to-high transition of data.

5. The jitter compensation circuit of claim 1, wherein the first and the second transistors are biased to operate in a linear region during the first and the second conduction states.

6. The jitter compensation circuit of claim 1, wherein the first and the second transistors are biased to operate in a linear region, and wherein the first and the second transistors conduct more current in the first conduction state than in the second conduction state.

7. The jitter compensation circuit of claim 1, wherein the comparator is configured to adjust the control current to operate the first transistor in the second conduction state when there is no high-to-low transition of data and to operate the second transistor in the second conduction state when there is no low-to-high transition of data.

8. The jitter compensation circuit of claim 1, wherein the first resistor is coupled between the gate terminals of the first and third transistors, and wherein the second resistor is coupled between the gate terminals of the second and third transistors.

9. The jitter compensation circuit of claim 1, wherein the first and second transistors mirror current in the third transistor when there is no transition of data.

10. The jitter compensation circuit of claim 1, wherein the first and second transistors mirror current in the third transistor when the voltage across the first and the second resistor is zero.

11. The jitter compensation circuit of claim 1, wherein the low-to-high transition is the rising edge of the transition of data, and wherein the high-to-low transition is the falling edge of the transition of data.

12. A jitter compensation circuit comprising:
   a first MOSFET having a first terminal coupled to a first voltage supply and having a second terminal coupled to a second voltage supply, the first MOSFET having a gate terminal driven by a first gate voltage responsive to a high-to low transition of data to operate the first MOSFET in a first conduction state and to operate in a second conduction state when there is no high-to-low transition of data;
   a second MOSFET having a first terminal coupled to the first voltage supply and having a second terminal coupled to the second voltage supply, the second MOS- FET having a gate terminal driven by a second gate voltage responsive to a low-to-high transition of data to operate the second MOSFET in the first conduction state and to operate in the second conduction state when there is no low-to-high transition of data;

a third MOSFET having a first terminal coupled to the first voltage supply and having a second terminal connected to a gate terminal;

a comparator having a first input coupled to the second voltage supply and having a second input coupled to a reference voltage, the comparator configured to generate a feedback control signal responsive to the second voltage supply and the reference voltage;

a current source coupled between the third MOSFET and ground, the current source configured to conduct a control current responsive to the feedback control signal;

a first resistor coupled between the gate terminals of the first and thirds MOSFETs;

a second resistor coupled between the gate terminals of the second and third MOSFETs, wherein during the second conduction state the first and the second MOSFETs mirror current in the third MOSFET, and wherein during the first conduction state current through the first and second MOSFETs charge the second voltage supply.

13. The jitter compensation circuit of claim 12 further comprising:

a first R-C circuit configured to generate the first gate voltage responsive to the high-to-low transition of data and coupled to apply the first gate voltage to the gate terminal of the first MOSFET; and a second R-C circuit configured to generate the second gate voltage responsive to the low-to-high transition of data and coupled to apply the second gate voltage to the gate terminal of the second MOSFET.

14. The jitter compensation circuit of claim 13, wherein the first R-C circuit comprises a first capacitor coupled to the first resistor, and wherein the first R-C circuit is configured to control the duration of the first conduction state responsive to the high-to-low transition of data.

15. The jitter compensation circuit of claim 13, wherein the second R-C circuit comprises a second capacitor coupled to the second resistor, and wherein the second R-C circuit is configured to control the duration of the first conduction state responsive to the low-to-high transition of data.

16. The jitter compensation circuit of claim 13, wherein the comparator is configured to control current to operate the first MOSFET in the second conduction state when there is no high-to-low transition of data and to operate the second MOSFET in the second conduction state when there is no low-to-high transition of data.

17. The jitter compensation circuit of claim 13, wherein the low-to-high transition is the rising edge of the transition of data, and wherein the high-to-low transition is the falling edge of the transition of data.

18. A jitter compensation system comprising:

a voltage regulator coupled to receive a first voltage supply and configured to generate a second voltage supply;

a closed-loop control circuit having a first input coupled to the second voltage supply and having a second input coupled to receive a reference voltage, the closed-loop control circuit configured to generate a feedback control signal responsive to the second voltage supply and the reference voltage;

a charge compensation circuit having a first input coupled to receive a first gate voltage responsive to a high-to-low transition of data and configured to operate in a first conduction state responsive to the first gate voltage and to operate in a second conduction state when there is no high-to-low transition of data, the charge compensation circuit having a second input coupled to receive a second gate voltage responsive to a low-to-high transition of data and configured to operate in the first conduction state responsive to the second gate voltage and to operate in the second conduction state when there is no low-to-high transition of data, the charge compensation circuit having a third input coupled to the first voltage supply and having a fourth input coupled to receive the feedback control signal, the charge compensation circuit configured to charge the second voltage supply during the first conduction state.

19. The jitter compensation system of claim 18, wherein the charge compensation circuit comprises:

a first MOSFET having a first terminal coupled to a first voltage supply and having a second terminal coupled to the second voltage supply, the first MOSFET having a gate terminal driven by the first gate voltage responsive to the high-to low transition of data to operate the first MOSFET at the first conduction state and to operate at the second conduction state when there is no high-to-low transition of data;

a second MOSFET having a first terminal coupled to the first voltage supply and having a second terminal coupled to the second voltage supply, the second MOSFET having a gate terminal driven by the second gate voltage responsive to the low-to-high transition of data to operate the second MOSFET at the first conduction state and to operate at the second conduction state when there is no low-to-high transition of data;

a first resistor coupled between the gate terminals of the first and thirds MOSFETs;

a second resistor coupled between the gate terminals of the second and third MOSFETs, wherein during the second conduction state the first and the second MOSFETs mirror current through the third MOSFET, and wherein during the first conduction state current through the first and second MOSFETs charge the second voltage supply.

20. The jitter compensation system of claim 18, wherein the closed-loop control circuit comprises:

a comparator having a first input coupled to the second voltage supply and having a second input coupled to a reference voltage, the comparator configured to generate the feedback control signal responsive to the second voltage supply and the reference voltage;

a current source coupled between the third MOSFET and ground, the current source configured to conduct a control current responsive to the feedback control signal, wherein current in the third MOSFET is adjusted based on the control current, and wherein during the second conduction state the first and the second transistors mirror the current in the third MOSFET.

21. The jitter compensation system of claim 20 further comprising:

a first R-C circuit configured to generate the first gate voltage responsive to the high-to-low transition of data and coupled to apply the first gate voltage to the gate terminal of the first MOSFET; and a second R-C circuit configured to generate the second gate voltage responsive to the low-to-high transition of data and coupled to apply the second gate voltage to the gate terminal of the second MOSFET.

22. The jitter compensation system of claim 20, wherein the first R-C circuit comprises a first capacitor coupled to the first resistor, and wherein the first R-C circuit is configured to control the duration of the first conduction state responsive to the high-to-low transition of data.

23. The jitter compensation system of claim 20, wherein the second R-C circuit comprises a second capacitor coupled to the second resistor, and wherein the second R-C circuit is configured to control the duration of the first conduction state responsive to the low-to-high transition of data.

* * * * *